(12) United States Patent
Zhang et al.

(10) Patent No.: US 11,539,457 B2
(45) Date of Patent: Dec. 27, 2022

(54) METHOD FOR ENCODING INFORMATION IN COMMUNICATION NETWORK

(71) Applicant: HUAWEI TECHNOLOGIES CO., LTD., Guangdong (CN)

(72) Inventors: Gongzheng Zhang, Hangzhou (CN); Hejia Luo, Hangzhou (CN); Rong Li, Hangzhou (CN); Ying Chen, Hangzhou (CN); Yunfei Qiao, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/174,794

(22) Filed: Feb. 12, 2021

(65) Prior Publication Data
US 2021/0234631 A1   Jul. 29, 2021

Related U.S. Application Data

(63) Continuation of application No. 16/885,244, filed on May 27, 2020, now Pat. No. 10,938,506, which is a (Continued)

(30) Foreign Application Priority Data

Jan. 5, 2017   (CN) .......................... 201710007883.2
Mar. 16, 2017  (CN) .......................... 201710157341.3

(51) Int. Cl.
H04L 1/00    (2006.01)
H03M 13/13   (2006.01)
H03M 13/00   (2006.01)

(52) U.S. Cl.
CPC .......... H04L 1/0013 (2013.01); H03M 13/13 (2013.01); H03M 13/6356 (2013.01);
(Continued)

(58) Field of Classification Search
CPC ..... H04L 1/0013; H04L 1/0057; H04L 1/005; H04L 1/0041; H04L 1/0068; H03M 13/13; H03M 13/6356
See application file for complete search history.

(56) References Cited

U.S. PATENT DOCUMENTS

2008/0301536 A1   12/2008   Shin et al.
2015/0194987 A1    7/2015   Li et al.
(Continued)

FOREIGN PATENT DOCUMENTS

CN   103023618   4/2013
CN   103684477   3/2014
(Continued)

OTHER PUBLICATIONS

Office Action issued in Russian Application No. 2019124520/07(047844) dated May 26, 2021, 15 pages (machine English translation).
(Continued)

Primary Examiner — Jaison Joseph
(74) Attorney, Agent, or Firm — Fish & Richardson P.C.

(57) ABSTRACT

Embodiments of the application provide a method for rate matching in a wireless communication network. A device obtains K information bits and a target code length M of a polar code, determines, according to a minimum value of a set of values, a mother code length $N_1$, polar encodes the K information bits to obtain an encoded sequence of $N_1$ bits, obtains a target sequence of M bits from the $N_1$ bit encoded sequence, and outputs the M-bit target sequence. When the mother code length $N_1$ is larger than the target code length M, ($N_1$-M) bits of the encoded sequence are punctured or shortened from the $N_1$ bit encoded sequence.

12 Claims, 6 Drawing Sheets

Related U.S. Application Data continuation of application No. 16/423,173, filed on May 28, 2019, now Pat. No. 10,700,809, which is a continuation of application No. 16/223,121, filed on Dec. 18, 2018, now Pat. No. 10,341,044, which is a continuation of application No. PCT/CN2018/070056, filed on Jan. 2, 2018.

(52) U.S. Cl.
CPC .......... *H04L 1/0041* (2013.01); *H04L 1/0045* (2013.01); *H04L 1/0057* (2013.01); *H04L 1/0068* (2013.01)

(56) References Cited

U.S. PATENT DOCUMENTS

| | | | | |
|---|---|---|---|---|
| 2015/0236715 | A1* | 8/2015 | Alhussien | H03M 13/6362 341/67 |
| 2015/0381208 | A1 | 12/2015 | Li et al. | |
| 2016/0056843 | A1* | 2/2016 | Gross | H03M 13/6561 714/781 |
| 2016/0182187 | A1* | 6/2016 | Kim | H03M 13/353 714/807 |
| 2016/0254876 | A1* | 9/2016 | Shen | H03M 13/618 714/776 |
| 2016/0269050 | A1* | 9/2016 | Shen | H04L 1/0071 |
| 2016/0285479 | A1* | 9/2016 | El-Khamy | H03M 13/616 |
| 2016/0352464 | A1 | 12/2016 | Shen et al. | |
| 2017/0012739 | A1 | 1/2017 | Shen et al. | |
| 2017/0019214 | A1* | 1/2017 | Shen | H04L 1/0067 |
| 2017/0047947 | A1* | 2/2017 | Hong | H04L 1/0067 |
| 2017/0230059 | A1* | 8/2017 | Giard | H03M 13/2927 |
| 2017/0264394 | A1 | 9/2017 | Shen et al. | |
| 2017/0331590 | A1* | 11/2017 | Wu | H03M 13/2792 |
| 2018/0026663 | A1* | 1/2018 | Wu | H03M 13/6362 714/776 |
| 2018/0076929 | A1* | 3/2018 | Zhang | H03M 13/11 |
| 2018/0226995 | A1* | 8/2018 | Wu | H03M 13/2778 |
| 2018/0278269 | A1* | 9/2018 | Jang | H03M 13/2792 |
| 2018/0294920 | A1* | 10/2018 | Chen | H04L 1/0057 |
| 2018/0367239 | A1* | 12/2018 | Jang | H04L 1/0041 |
| 2019/0036552 | A1* | 1/2019 | Sasoglu | H04W 28/06 |
| 2019/0044540 | A1* | 2/2019 | Jiang | H03M 13/2796 |

FOREIGN PATENT DOCUMENTS

| | | |
|---|---|---|
| CN | 104038234 | 9/2014 |
| CN | 104539393 | 4/2015 |
| CN | 105850059 | 8/2016 |
| CN | 109565288 A | 4/2019 |
| CN | 105164959 | 6/2019 |
| EP | 1176725 A2 | 1/2002 |
| EP | 3497791 A1 | 6/2019 |
| EP | 2936755 | 5/2020 |
| JP | 2019527978 | 10/2019 |
| KR | 20160115803 | 10/2016 |
| RU | 2450480 C2 | 5/2012 |
| WO | 2015139297 | 9/2015 |
| WO | 2016082142 | 6/2016 |
| WO | 2018028294 A1 | 2/2018 |

OTHER PUBLICATIONS

Daolong Wu et al.,"Construction and Block Error Rate Analysis of Polar Codes Over AWGN Channel Based on Gaussian Approximation," IEEE Communications Letters, vol. 18, No. 7, Jul. 2014, total 4 pages.
Ericsson Intel Interdigital LG ATandT:"WF on Mother Code Size of Polar Codes", 3GPP Draft R1-1703616, vol. RAN WG1 No. Athens, Greece;Feb. 13, 2017-Feb. 17, 2017, Feb. 17, 2017, XP051236741, 4 pages.
Huawei, HiSilicon, Polar code design and rate matching . 3GPP TSG RAN WG1 Meeting #86, Gothenburg, Sweden, Aug. 22-26, 2016, R1-167209, 5 pages.
Mostafa El-Khamy et al.,"HARQ Rate-Compatible Polar Codes for Wireless Channels", 2015 IEEE Global Communications Conference (GLOBECOM),total 6 pages.
R1 -1611254 Huawei et al.,"Details of the Polar code design," 3GPP TSG RAN WG1 Meeting #87,Reno, USA, Nov. 10-14, 2016,total 15 pages.
Samsung:"Design of Unified Rate-Matching for Polar Codes", 3GPP Draft;R1-1710750, vol. RAN WG1, No. Qingdao P .R.China Jun. 27, 2017-Jun. 30, 2017, Jun. 20, 2017, XP051305768 , 6 pages.
Samsung:"Performance of Short-Length Polar Codes", 3GPP Draft;R1-1609072, vol. RAN WG1, No. Lisbon, Portugal; Oct. 10, 2016-Oct. 14, 2016, Oct. 9, 2016, XP051 149123, 13 pages.
Kiaoqian Lv et al.,"A Novel Rate—Adaptive Distributed Source Coding Scheme Using Polar Codes",IEEE Communications Letters (vol. 17, Issue: 1 , Jan. 2013 ), total 4 pages.
Office Action issued in Japanese Application No. 2020-215190 dated Jan. 17, 2022, 6 pages (with English translation).
Qualcomm Incorporated, "Design of Polar codes for control channel," 3GPP TSG-RAN WG1 NR AdHoc, R1-1700832, Spokane, USA, Jan. 16-20, 2017, 5 pages.
Qualcomm et al., "WF on rate matching for Polar codes," 3GPP TSG RAN WG1 #89, R1-1709362, Hangzhou, China, May 15-19, 2017, 4 pages.
Session Chairman (Nokia), "Chairman's Notes of Agenda Item 7.1.4 Channel coding," 3GPP TSG RAN WG1 Meeting #89, R1-1709681, Hangzhou, China, May 15-19, 2017, 7 pages.
Extended European Search Report issued in European Application No. 21190257.2 dated Mar. 25, 2022, 13 pages.
LG Electronics, "Discussions on polar code design," 3GPP TSG RAN WG1 Meeting #85, R1-164565, Nanjing, China May 23-27, 2016, 5 pages.

\* cited by examiner

METHOD FOR ENCODING INFORMATION IN COMMUNICATION NETWORK

CROSS-REFERENCE TO RELATED APPLICATIONS

This application is a continuation of U.S. patent application Ser. No. 16/885,244, filed on May 27, 2020, which is a continuation of U.S. patent application Ser. No. 16/423,173, filed on May 28, 2019, now U.S. Pat. No. 10,700,809, which is a continuation of U.S. patent application Ser. No. 16/223,121, filed on Dec. 18, 2018, now U.S. Pat. No. 10,341,044, which is a continuation of International Application No. PCT/CN2018/070056, filed on Jan. 2, 2018. The International Application claims priority to Chinese Patent Application No. 201710157341.3, filed on Mar. 16, 2017 and Chinese Patent Application No. 201710007883.2, filed on Jan. 5, 2017. All of the aforementioned patent applications are hereby incorporated by reference in their entireties.

TECHNICAL FIELD

Embodiments of the application relate to the communications field, and more specifically, to method and apparatus for encoding information.

BACKGROUND

Channel encoding is used in communication systems to improve data transmission reliability, so as to ensure communication quality. Polar codes, proposed by Professor Arikan of Turkey, are the first kind of codes that are theoretically proven to be able to achieve the Shannon capacity and having low encoding and decoding complexity.

A polar code is a linear block code. An encoding matrix of the polar code is $G_N$, which is an N×N matrix. An encoding process for generating a polar code $x_1^N = (x_1, x_2, \ldots, x_N)$ is:

$$x_1^N = u_1^N G_N$$

where $u_1^N = (u_1, u_2, \ldots, u_N)$ is a binary row vector having a length of N bits (N is also called a mother code length), $G_N$ is the coding matrix, and $G_N = F_2^{\otimes(log_2(N))}$, $F_2^{\otimes(log_2(N))}$ is a Kronecker product of a number of $log_2 N$ matrices $F_2$, and the matrix $F_2$ is:

$$F_2 = \begin{bmatrix} 1 & 0 \\ 1 & 1 \end{bmatrix}.$$

In the encoding process of the polar code, some bits in the row vector $u_1^N$ are used to cam information, and these bits are referred to as information bits. An index set of these bits is represented by a set A. Other bits are set to a fixed value that is pre-agreed upon between a receiving end and a transmitting end of the polar code, and these bits are referred to as fixed bits or frozen bits. An index set of the fixed bits or frozen bits is represented by a set $A^c$, which is a complement set of set A.

The encoding process of the polar code $x_1^N = u_1^N G_N$ is equivalent to $x_1^N = u_A G_N(A) \oplus u_{A^c} G_N(A^c)$. Herein, $G_N(A)$ is a submatrix formed by rows in the $G_N$ that correspond to indexes in the set A, and $G_N(A^c)$ is a submatrix formed by rows in the $G_N$ that correspond to indexes in the set $A^c$. $u_A$ is an information bit set of the $u_1^N$, and the number of the information bits in the $u_A$ is K. $u_{A^c}$ is a frozen bit set of the $u_1^N$, and the number of the frozen bits in the $u_{A^c}$ is N−K. The frozen bits are known bits. Value of the frozen bits is normally set to 0, but the value of the frozen bits may be randomly set, provided that the receiving end and the transmitting end of the polar code have pre-agreed on the value of the frozen bits. When the frozen bits are set to 0, a polar code encoding output may be simplified as $x_1^N = u_A G_N(A)$, in which $G_N(A)$ is a K×N matrix.

A process of constructing a polar code is a process of selecting the set A, and the selection of the set A determines the performance of the polar code. The process of constructing the polar code normally includes: determining, based on a mother code length N, that a total of N polarized channels exist, where each of the polarized channels corresponds to one row in an encoding matrix, respectively; calculating a reliability of each of the polarized channels; forming the information bit index set A using indexes of first K polarized channels with relatively high reliabilities, and forming the frozen bit index set $A^c$ using indexes of the remaining (N−K) polarized channels. The set A determines bit positions of the information bits in $x_1^N$, and the set $A^c$ determines bit positions of the frozen bits in $x_1^N$.

It can be learned from the encoding matrix that a code length of an original polar code (mother code) is an integer power of 2. In practical applications, however, length of a polar code need to be set to any code length, and this is achieved by a process called rate matching.

In the prior art, a puncturing or a shortening manner is used for rate matching. A mother code whose length exceeds a target code length is usually punctured or shortened, to achieve the target code length. The punctured or shortened code is filled during decoding, to restore to the length of the mother code. Buffer sizes, complexity, and delays during the encoding and the decoding are related to the mother code length. When a relatively large quantity of bits are shortened or punctured (for example, the mother code is shortened or punctured from 2048 bits to 1200 bits), additional overheads due to the puncturing are quite high. An increase in the target code length results in a decrease in a code rate. On the one hand, this may bring an encoding gain; on the other hand, the complexity also increases as the mother code length increases.

SUMMARY

Embodiments of the present application provide a rate matching method, an encoding apparatus, a rate de-matching method, a decoding apparatus, and a communications apparatus, to reduce complexity of polar encoding and decoding.

According to a first aspect, a rate matching method for a polar code is provided, including: obtaining an information bit sequence and a target code length M of a polar code; and when the target code length M meets a preset condition, using a polar code with a first mother code length $N_1$ to encode the information bit sequence, to output a first encoded bit sequence, where $N_1$ is less than or equal to M, and $N_1$ is an integer power of 2, and repeating at least some bits in the first encoded bit sequence, to obtain a first target polar code with a length M; or when the target code length M does not meet the preset condition, using a polar code with a second mother code length $N_2$ to encode the information bit sequence, to output a second encoded bit sequence, where $N_2$ is greater than or equal to M, and $N_2$ is an integer power of 2, and shortening or puncturing the second encoded bit sequence, to obtain a second target polar code with a length M.

According to a second aspect, an encoding apparatus is provided, including:

an obtaining unit, configured to obtain an information bit sequence and a target code length M of a polar code:

an encoding unit, configured to: when the target code length M meets a preset condition, use a polar code with a first mother code length $N_1$ to encode the information bit sequence, to output a first encoded bit sequence, wherein $N_1$ is less than or equal to M, and $N_1$ is an integer power of 2; or when the target code length M does not meet the preset condition, use a polar code with a second mother code length $N_2$ to encode the information bit sequence, to output a second encoded bit sequence, where $N_2$ is greater than or equal to M, and $N_2$ is an integer power of 2; and a rate matching unit, configured to: repeat at least some bits in the first encoded bit sequence, to obtain a first target polar code with a length M; or shorten or puncture the second encoded bit sequence, to obtain a second target polar code with a length M.

According to a third aspect, a communications apparatus is provided, including: a transceiver, configured to communicate with another device; a memory, configured to store a program; and a processor, configured to execute the program stored in the memory. When the program is executed, the processor is configured to: when a target code length M during polar encoding meets a preset condition, use a polar code with a first mother code length $N_1$ to encode an information bit sequence, to output a first encoded bit sequence, where $N_1$ is less than or equal to M, and $N_1$ is an integer power of 2, and repeat at least some bits in the first encoded bit sequence, to obtain a first target polar code with a length M; or when the target code length M does not meet the preset condition, use a polar code with a second mother code length $N_2$ to encode the information bit sequence, to output a second encoded bit sequence, where $N_2$ is greater than or equal to M, and $N_2$ is an integer power of 2, and shorten or puncture the second encoded bit sequence, to obtain a second target polar code with a length M.

According to a fourth aspect, a rate de-matching method for a polar code is provided, including:

receiving a log-likelihood ratio LLR of a to-be-decoded bit sequence with a length M where M is a target code length during polar encoding; and when the target code length M meets a preset condition, determining that a transmitting end uses a repetition manner; determining a location of a repeated bit; adding and combining an LLR, at a repetition location, in received LLRs of M bits, to obtain an LLR of a first to-be-decoded bit sequence whose length is a first mother code length $N_1$, where $N_1$ is less than or equal to M, and $N_1$ is an integer power of 2; and polar decoding based on the LLR of the first to-be-decoded bit sequence; or when the target code length M does not meet the preset condition, determining that the transmitting end uses a shortening or puncturing; determining a shortening or puncturing location and an LLR at the shortening or puncturing location; restoring the received LLRs of M bits to a second mother code length $N_2$, to obtain an LLR of a second to-be-decoded bit sequence whose length is the second mother code length $N_2$, where $N_2$ is greater than or equal to M, and $N_2$ is an integer power of 2; and polar decoding based on the LLR of the second to-be-decoded bit sequence.

According to a fifth aspect, a decoding apparatus is provided, including:

a receiving unit, configured to receive a log-likelihood ratio LLR of a to-be-decoded bit sequence with a length M, wherein M is a target code length during polar encoding;

a rate de-matching unit, configured to: when the target code length M meets a preset condition, determine that a transmitting end uses a repetition manner to implement rate matching; determine a location of a repeated bit; and add and combine an LLR, at a repetition location, in received LLRs of M bits, to obtain an LLR of a first to-be-decoded bit sequence whose length is a first mother code length $N_1$, where $N_1$ is less than or equal to M, and $N_1$ is an integer power of 2; or configured to: when the target code length M does not meet the preset condition, determine that the transmitting end uses a shortening or puncturing method to implement rate matching; determine a shortening or puncturing location and an LLR at the shortening or puncturing location; and restore the received LLRs of M bits to a second mother code length $N_2$, to obtain an LLR of a second to-be-decoded bit sequence whose length is the second mother code length $N_2$, where $N_2$ is greater than or equal to M, and $N_2$ is an integer power of 2; and a decoding unit, configured to perform polar decoding based on the LLR of the first to-be-decoded bit sequence or the LLR of the second to-be-decoded bit sequence.

According to a sixth aspect, a communications apparatus is provided, including: a transceiver, configured to communicate with another device; a memory, configured to store a program; and a processor, configured to execute the program stored in the memory, where when the program is executed, the processor is configured to: when a target code length M during polar encoding meets a preset condition, determine that a transmitting end uses a repetition manner to implement rate matching; determine a location of a repeated bit; add and combine an LLR, at a repetition location, in received LLRs of M bits, to obtain an LLR of a first to-be-decoded bit sequence whose length is a first mother code length $N_1$, where $N_1$ is less than or equal to M, and $N_1$ is an integer power of 2; and perform polar decoding based on the LLR of the first to-be-decoded bit sequence; or when the target code length M does not meet the preset condition, determine that the transmitting end uses a shortening or puncturing method to implement rate matching; determine a shortening or puncturing location and an LLR at the shortening or puncturing location; restore the received LLRs of M bits to a second mother code length $N_2$, to obtain an LLR of a second to-be-decoded bit sequence whose length is the second mother code length $N_2$, where $N_2$ is greater than or equal to M, and $N_2$ is an integer power of 2; and perform polar decoding based on the LLR of the second to-be-decoded bit sequence.

According to a seventh aspect, a rate matching method for a polar code is provided, including:

obtaining an information bit sequence and a first code rate $R_1$, where $R_1 = K/N_1$, K is a quantity of the information bits, $N_1 = 2^n$, n is an integer less than or equal to $\log_2 M$, and M is a target code length during polar encoding:

if the first code rate $R_1$ is less than or equal to a predetermined second code rate $R_2$, using a polar code with a mother code length $N_1$ to encode the information bit sequence, to output $N_1$ encoded bits; and repeating at least some of the $N_1$ encoded bits, to obtain a first target polar code with a length M; or if the first code rate $R_1$ is greater than the second code rate $R_2$, using a polar code with a mother code length $N_2$ to encode the information bit sequence, to output $N_2$ encoded bits, where $N_2$ is greater than or equal to the target code length M, and $N_2$ is an integer power of 2; and shortening or puncturing the $N_2$ encoded bits, to obtain a second target polar code with a length M.

According to an eighth aspect, a rate matching method for a polar code is provided, and the method includes:

obtaining a preset maximum mother code length $N_{max}$, where $N_{max}$ is an integer power of 2; and if a target code length M during polar encoding is greater than the maximum mother code length $N_{max}$, using a polar code with a mother code length $N_{max}$ to encode an information bit sequence, to output $N_{max}$ encoded bits; and repeating at least some of the $N_{max}$ encoded bits, to obtain a first target polar code with a length M; or if the target code length is less than the maximum mother code length $N_{max}$, using a polar code with a mother code length N to encode the information bit sequence, to output N encoded bits, where N is greater than or equal to the target code length M, and N is an integer power of 2; and shortening or puncturing the N encoded bits, to obtain a second target polar code with a length M.

According to a ninth aspect, a rate matching method for a polar code is provided, and the method includes obtaining an information bit sequence and a target code length M of a polar code; and selecting, from a set of values of a first mother code length $N_1$ that meet any one of the following three preset conditions, a minimum value as a value of the first mother code length $N_1$, and using a repetition rate matching scheme; or if no value of the first mother code length $N_1$ meets any one of the following preset conditions, using a shortening or puncturing rate matching scheme, where the three preset conditions are:

a first code rate $R_1$ determined based on a quantity K of the information bits and the target code length M is less than or equal to a preset second code rate $R_2$, and $R_1=K/N_1$;

the target code length is greater than a preset maximum mother code length $N_{max}$, and the first mother code length $N_1$ is $N_{max}$; and a difference between the target code length M and the first mother code length $N_1$ is less than a preset range, wherein $N_1$ is less than or equal to M, and $N_1$ is an integer power of 2.

With reference to the first aspect, the second aspect, the third aspect, the seventh aspect, or the eighth aspect, in a possible implementation, the at least some bits in the first encoded bit sequence are repeated according to a preset rule, and the preset rule includes any one of the following manners; in an order from back to front, in an order from front to back, in a random order, in a bit reversal order from front to back, in a bit reversal order from front to back, or in a descending order of reliability.

With reference to the fourth aspect, the fifth aspect, or the sixth aspect, in a possible implementation, the repetition location is determined according to a preset rule, and the preset rule includes any one of the following manners: in an order from back to front, in an order from front to back, in a random order, in a bit reversal order from back to front, in a bit reversal order from front to back, or in a descending order of reliability.

With reference to any one of the first aspect to the sixth aspect, in a possible implementation, the preset condition is: a first code rate $R_1$ determined based on a quantity K of the information bits and the target code length is less than or equal to a preset second code rate $R_2$, where the first code rate is $R_1=K/N_1$, K is a quantity of to-be-encoded information bits, $N_1=2^n$, and n is an integer less than or equal to $\log_2 M$. In a possible implementation, the first mother code length is a maximum integer less than or equal to $\log_2 M$. In a possible implementation, a value of the second code rate is 1/4, 1/3, 1/4, 1/5, 1/6, 1/7, 1/8, 1/9, 1/10, 1/11, 1/12, 2/7, 3/8, 2/9, 3/10, 2/11, or 3/11.

With reference to any one of the first aspect to the sixth aspect, in a possible implementation, the preset condition is: the target code length is greater than a preset maximum mother code length $N_{max}$. In a possible implementation, the first mother code length is $N_{max}$. In a possible implementation, $N_{max}$ is 8192, 4096, 2048, 1024, 512, 256, 128, or 64.

With reference to all of the foregoing aspects, in a possible implementation, the second mother code length is a minimum integer power of 2 that is greater than or equal to the target code length.

With reference to any one of the first aspect to the sixth aspect, in a possible implementation, the preset condition is: at least one of the following conditions is met, and a minimum value in a set of all determined values of the first mother code length that meet any one of the following conditions is used as a value of the first mother code length:

a first code rate $R_1$ determined based on a quantity K of the information bits and the target code length M is less than or equal to a preset second code rate $R_2$, and $R_1=K/N_1$;

the target code length is greater than a preset maximum mother code length $N_{max}$, and $N_1=N_{max}$; or a difference between the target code length M and the first mother code length $N_1$ is less than a preset range.

With reference to any one of the first aspect to the sixth aspect, in a possible implementation, the preset condition is: a difference between the target code length M and the first mother code length $N_1$ is less than a preset range, where $N_1$ is less than or equal to M, and $N_1$ is an integer power of 2. In a possible implementation, that a difference between the target code length M and the first mother code length $N_1$ is less than a preset range is indicated by one of the following:

$$M \leq N_1 * (1 + \delta);$$

$$\frac{M}{N_1} \leq (1 + \delta);$$

$$M - N_1 \leq N_1 * \delta; \text{ or}$$

$$\frac{M - N_1}{N_1} \leq \delta.$$

In a possible implementation, δ is a constant, for example, a value may be 1/8, 1/4, or 3/8.

In a possible implementation, a value of S is a function of a first code rate $R_1$, δ decreases as $R_1$ increases, and $$R_1 = \frac{K}{N_1}.$$

In a possible implementation, a function relationship between δ and the first code rate $R_1$ is:

$\delta=\beta*(1-R_1)$, or $\delta=\beta*(1-R_1)^2$, where β is a constant, for example, β may be 1/2, 3/8, 1/4, 1/8, or 1/16.

In a possible implementation, a function relationship between δ and the first code rate $R_1$ is:

$$\delta = \begin{cases} a, & \text{if } R_1 < R_3 \\ 0, & \text{if } R_1 \geq R_3 \end{cases},$$

where a is a constant and may be 1/16, 1/4, 3/8, 1/2, or the like, $R_3$ is a code rate threshold and is a constant, and $R_3$ may be 1/4, 1/6, 1/3, 1/5, 1/7, 1/8, 1/9, 1/10, 1/11, 1/12, 2/7, 3/8, 2/9, 3/10, 2/11, 3/11, or the like.

Another aspect of this application provides a computer readable storage medium, the computer readable storage medium stores an instruction, and when the instruction is run on a computer, the computer executes the method described in the foregoing aspects.

Another aspect of this application provides a computer program product including an instruction, and when the computer program product is run on a computer, the computer executes the method described in the foregoing aspects.

Another aspect of this application provides a computer program, and when the computer program is run on a computer, the computer executes the method described in the foregoing aspects.

Another aspect of this application provides a communications apparatus, including: a memory, configured to store a program; and a processor, configured to execute the program stored in the memory, where when the program is executed, the processor is configured to execute the method described in the first aspect, the fourth aspect, the seventh aspect, the eighth aspect, or the ninth aspect, or execute any possible implementation of the first aspect, the fourth aspect, the eighth aspect, or the ninth aspect.

In the embodiments of this application, which rate matching manner is to be used is determined based on the target code length. When the preset condition is met, the repetition is used. Because the mother code length is less than or equal to the target code length, when the target code length is not an integer power of 2, the used mother code length is less than a mother code length determined in a shortening or puncturing. This can meet an encoding gain requirement and reduce encoding and decoding complexity, thereby reducing a delay. When the target code length does not meet the preset condition, the shortening or puncturing is used. A decoder side determines, in a corresponding manner, a rate matching manner used by an encoder side, and performs rate de-matching and decoding. According to the embodiments of this application, a desirable balance is achieved between an encoding gain loss and complexity.

DESCRIPTION OF EMBODIMENTS

Figure 1:
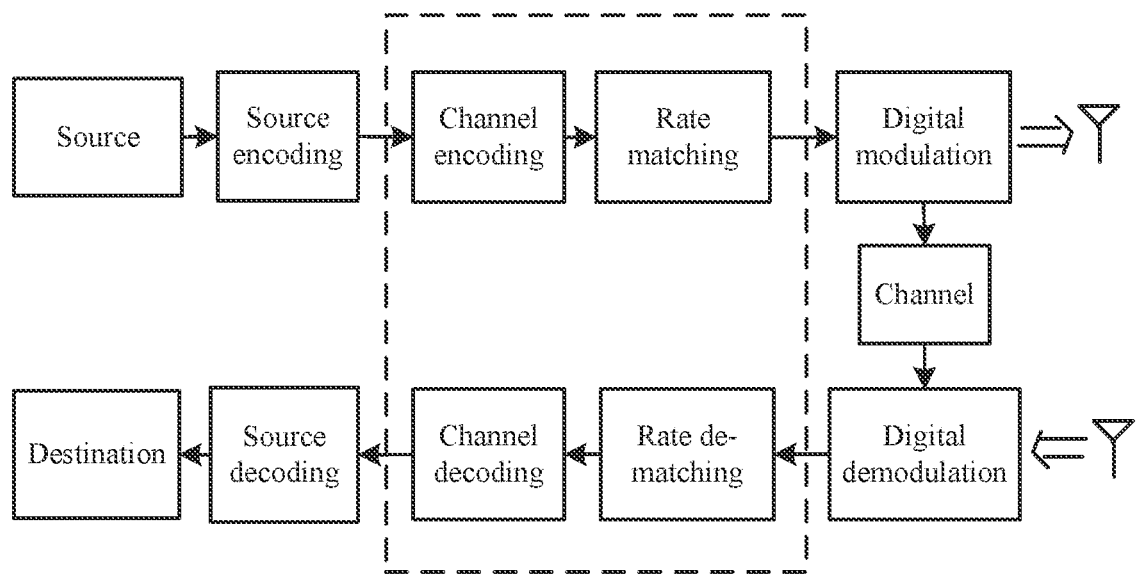
FIG. 1 is a schematic diagram of a basic wireless communication process between a transmitting end and a receiving end.

FIG. 1 shows a basic procedure of wireless communication. Communication signals are transmitted from a transmitting device (referred to as transmitting end hereinafter) to a receiving device (referred as receiving end hereinafter). At the transmitting end, a signal from a signal source is source encoded, channel encoded, rate matched, modulation mapped, and then transmitted to the receiving end. At the receiving end, after de-mapping demodulation, rate de-matching, channel decoding, and source decoding, the signal is output to a signal destination. In channel encoding and channel decoding, the polar coding process as described above can be used. Because a code length of an original polar code (mother code) is an integer power of 2, in practical applications, the code length may need to be adjusted to a different code length. This can be achieved through rate matching. As shown in FIG. 1, at the transmitting end, the rate matching is performed after the channel encoding, to achieve any target code length. At the receiving end, a rate de-matching is performed before channel decoding, to restore the polar code to its original length.

The technical solutions in the embodiments of this application may be applied to the fifth generation (5G) communication systems, and may also be applied to other communications systems, such as Global System for Mobile Communications (GSM), Code Division Multiple Access (CDMA) systems, Wideband Code Division Multiple Access (WCDMA) systems, General Packet Radio Service (GPRS) systems, Long Term Evolution (LTE) systems, LTE Frequency Division Duplex (FDD) systems, LTE Time Division Duplex (TDD) systems, and Universal Mobile Telecommunication Systems (UMTS).

According to a rate matching method for a polar code provided in an embodiment of this application, a mother code length, that is less than or equal to a target code length (and greater than a quantity of information bits) and that is an integer power of 2, is determined. A polar code is constructed and encoded based on the determined mother code length. The encoded bits are repeated, to obtain a target code length, so as to implement rate matching on the polar code. A rate matching and rate de-matching process is as follows:

(1) Determine a mother code length $N=2^n$ that is less than or equal to a target code length M and that is an integer power of 2 (n≤$\log_2 M$, and n is an integer). The target code length M is determined based on a quantity K of information bits and a code rate R, and M=INT(K/R), where INT indicates rounding.

(2) Construct a polar code whose mother code length is N and whose quantity of information bits is K, and encode the polar code, to obtain an encoded bit sequence.

(3) Repeat at least some bits in the encoded bit sequence according to a preset order, until the target code length M is reached, to obtain a rate matched bit sequence.

(4) A receiving end obtains log-likelihood ratios (LLRs) of the M bits, determines locations of repeated bits, and combines LLRs of repeated locations, to obtain LLRs of N to-be-decoded bits, so as rate de-matching the received M bits. The receiving end then performs decoding based on the LLRs of the N to-be-decoded bits.

In the repetition manner of rate matching, because the mother code length is less than the target code length, and the mother code length is less than that in solutions used in the prior art, encoding and decoding complexity is reduced.

When a mother code length is larger, performance caused by an encoding gain is better, but complexity is higher. A decrease in a code rate results in an increase in a mother code length, and less performance improvement is achieved by the encoding gain. Therefore, a problem of balancing an encoding gain and complexity may be further resolved by using an encoding parameter. For example, a condition may be set for a target code length. When the condition is met, a repetition manner is used to implement rate matching. In the repetition manner, a mother code length is less than the target code length. In this case, complexity is relatively low, and a gain loss caused by the repetition falls within an acceptable range. When the specified condition is not met, a puncturing or shortening manner is used to implement rate matching. In this case, a determined mother code length is greater than the target code length, and the target code length is obtained through shortening or puncturing. In this case, complexity is relatively high, but a gain loss is reduced.

Figure 2:
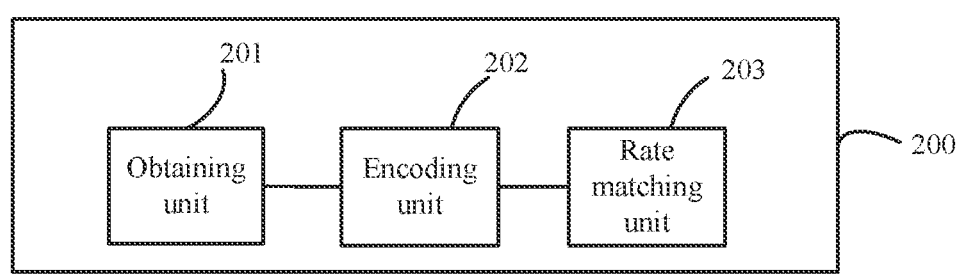
FIG. 2 is a block diagram of an encoding apparatus according to an embodiment of this application.
Figure 3:
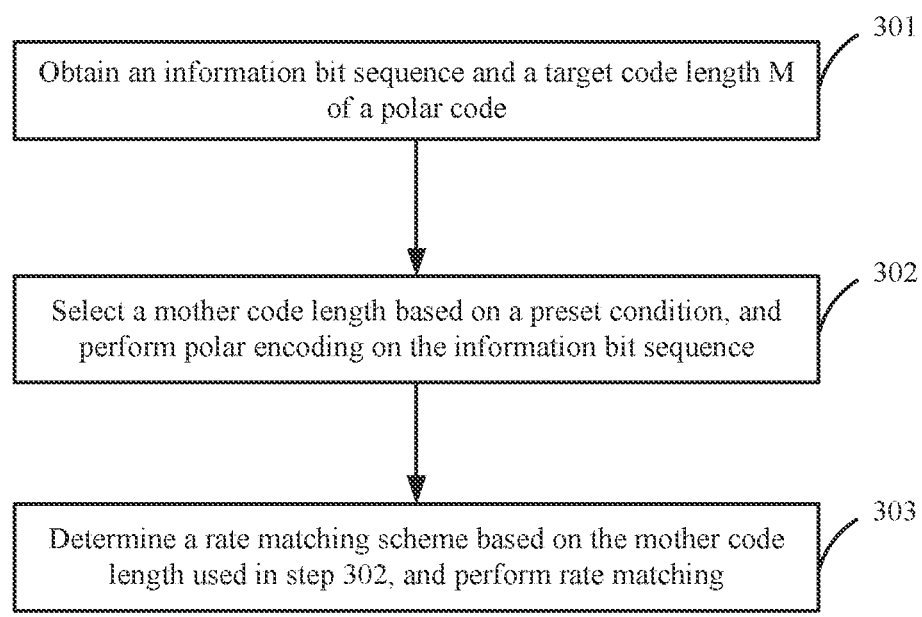
FIG. 3 is a flowchart of a rate matching method according to an embodiment of this application.

An encoding apparatus 200 is shown in FIG. 2. The encoding apparatus 200 includes an obtaining unit 201, an encoding unit 202 and a rate matching unit 203. The encoding apparatus 200 is configured to perform encoding and rate matching. As shown in FIG. 3, an encoding and rate matching process includes the following operations.

301. Obtain an information bit sequence, and obtain a target code length M of a polar code.

This step may be implemented by the obtaining unit 201 in FIG. 2. The obtaining unit 201 obtains the information bit sequence and the target code length M of the polar code. The target code length may be determined based on a quantity K of the information bits and an adopted code rate R. For example, if the quantity of information bits is 20, and the code rate is 1/8, the target code length is 160.

302. Select a mother code length based on a preset condition, and polar encoding the information bit sequence.

Specifically, when the target code length M meets the preset condition, the encoding unit 202 uses a polar code with a first mother code length $N_1$ to encode the information bit sequence, to output a first encoded bit sequence with a length $N_1$. $N_1$ is less than or equal to M, and $N_1$ is an integer power of 2.

When the target code length M does not meet the preset condition, the encoding unit 202 uses a polar code with a second mother code length $N_2$ to encode the information bit sequence, to output a second encoded bit sequence with a length $N_2$. $N_2$ is greater than or equal to M, and $N_2$ is an integer power of 2.

303. Determine a rate matching manner based on the mother code length used in step 302, and perform rate matching.

When the target code length M meets the preset condition, because the mother code length $N_1$ used in step 302 is less than or equal to the target code length, the rate matching unit 203 repeats at least some bits in the first encoded bit sequence, to obtain a first target polar code with a length M.

When the target code length M does not meet the preset condition, the mother code length $N_2$ used in step 302 is greater than or equal to the target code length, and correspondingly, the rate matching unit 203 shortens or punctures the second encoded bit sequence, to obtain a second target polar code with a length M.

When a repetition manner is used in rate matching, repetition may be performed according to a predetermined order, until the target code length M is obtained, to obtain the target polar code. The predetermined order may be any one of the following:

an order from back to front,
an order from front to back,
a random order,
a bit reversal order from back to front,
a bit reversal order from front to back,
a descending order of reliability, or
any other orders.

The bit reversal order is to convert a decimal integer (an index of an encoded bit) into a binary form, negate an order of elements of a binary digit, and convert the negated binary digit into a decimal digit. The newly obtained digit is a bit reversal order value of an original digit. The reliability herein is reliability of a polarized channel corresponding to an encoded bit. Performing repetition based on a descending order of reliability indicates that a more important encoded bit is to be preferentially repeated.

Figure 4:
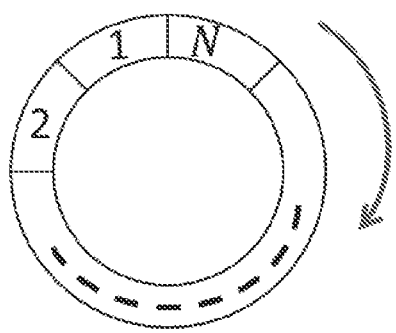
FIG. 4 is a schematic diagram of a cyclic buffer according to an embodiment of this application.

$N_1$ encoded bits may be stored, according to the foregoing preset rule, in a cyclic buffer shown in FIG. 4, and the encoded bits are read from the cyclic buffer in order during rate matching, until the target code length M is obtained. Assuming that $N_1$ is 128, and M is 160, 32 encoded bits need to be repeated. 128 encoded bits are arranged based on reliability and then stored in the cyclic buffer. The first to $128^{th}$ bits are read in order, and 32 bits are then read, to obtain a polar code with a length 160.

That the target code length M meets the preset condition described in step 302 and step 303 may be that a first code rate $R_1$ determined based on the quantity K of information bits and the first mother code length $N_1$ is less than or equal to a preset second code rate $R_2$. The first code rate $R_1$ herein is equal to $K/N_1$. K is the quantity of information bits, $N_1=2^n$, and n is an integer less than or equal to $\log_2 M$. To be specific, N is an integer power of 2 and less than or equal to the target code length M. The second code rate is a code rate threshold and used to determine the rate matching manner.

To be specific, if $R_1 \leq R_2$, the first mother code length $N_1$ less than the target code length is used for encoding, to output the $N_1$ encoded bits, and at least some of the $N_1$ encoded bits are repeated, to obtain the target polar code with the length M. If $R_1 > R_2$, a minimum integer power of 2 that is greater than or equal to the target code length is used as the second mother code length $N_2$, to encode the information bit sequence and output $N_2$ encoded bits, and the $N_2$ encoded bits are shortened or punctured, to obtain the second target polar code with the length M. The mother code length is determined by comparing the first code rate and the second code rate. Correspondingly, the rate matching manner is determined. The second code rate may also be referred to as a mother code code rate threshold. A value of the mother code code rate threshold may be set depending on an actual application case. In this embodiment of this application, the mother code code rate threshold may be flexibly set to a value between κ and 1 depending on an application scenario. For example, a value of $R_2$ includes but is not limited to 1/3, 1/4, 1/5, 1/6, 1/7, 1/8, 1/9, 1/10, 1/11, 1/12, 2/7, 3/8, 2/9, 3/10, 2/11, or 3/11. The value of $R_2$ is neither limited to the examples listed herein, nor limited to a fraction form used herein, and may be set to a value with a decimal point such as 0.167.

Figure 5:
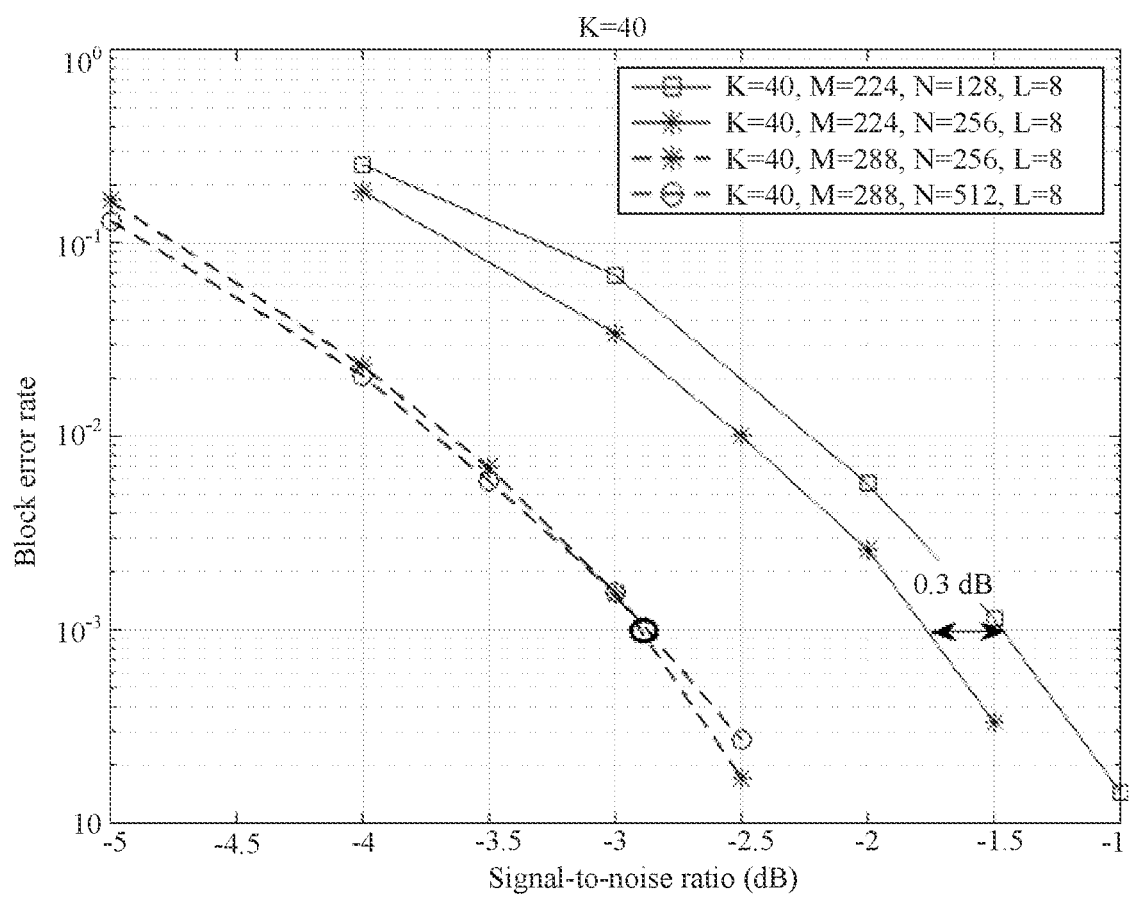
FIG. 5 is a diagram of a performance comparison in an additive white gaussian noise (AWGN) channel between a repetition-based rate matching manner and a shortening-based rate matching manner that are determined by using a code rate threshold.

Determining of the code rate threshold may balance an encoding gain and complexity. FIG. 5 shows a performance comparison between a repetition rate matching manner and a shortening manner that are used in an additive white Gaussian noise (AWGN) channel when a quantity of information bits is 40 and different code rates are used. A target code length M corresponding to two solid lines is 224. A square box indicates that a repetition rate matching manner is used, 128 bits (the first mother code length $N_1$) are obtained through encoding, and 96 bits are repeated, to obtain 224 bits (the target code length). An asterisk "*" indicates that a shortening rate matching manner is used, and 256 bits (the second mother code length $N_2$) are obtained through encoding and are shortened by 32 bits to obtain 224 bits (the target code length). That the code rate threshold $R_2$ is equal to 1/4 is used as an example. In this case, $R_1=K/N_1=40/128>1/4$, and $R_1 \leq R_2$ is not met. Therefore, a puncturing or shortening manner may be used to perform rate matching. It can be learned that, when a block error rate is $10^{-3}$, an encoding gain loss in the repetition-based rate matching manner is approximately 0.3 dB. When a code rate is higher, a mother code length is smaller, and an encoding gain loss is higher. Therefore, when the first code rate is greater than the code rate threshold, the shortening or puncturing manner is suitable.

A target code length corresponding to two dashed lines in FIG. 5 is 288. An asterisk "*" indicates that a repetition rate matching manner is used, 256 bits (the first mother code length $N_1$) are obtained through encoding, and 32 bits are repeated, to obtain 288 bits. A circle "o" indicates that a shortening rate matching manner is used, and 512 bits (the second mother code length $N_2$) are obtained through encoding and are shortened by 224 bits to obtain 288 bits. It can be learned that an encoding gain in the repetition-based rate matching manner is equivalent to that in the shortening-based rate matching manner; however, the mother code length in the repetition-based rate matching manner is half of that in the shortening-based rate matching manner. Therefore, encoding and decoding delays and complexity in the repetition-based rate matching manner are significantly lower than those in the shortening-based rate matching manner. That the code rate threshold $R_2$ is equal to 1/4 is used as an example. In this case, $R_1=K/N_1=40/256<1/4$, and the preset condition $R_1 \leq R_2$ is met. Therefore, the repetition-based rate matching manner is determined. When a code rate is lower, a code length is larger, and encoding gains are closer; however, the repetition-based rate matching manner can reduce complexity significantly and reduce a delay.

In this embodiment of this application, $N_1=2^n$, where n is an integer less than or equal to $\log_2 M$. For example, when M=224, 7 is obtained by performing rounding on $\log_2 M$, and in theory, a value of n may range from 1 to 7. In the example shown in FIG. 5, in the repetition-based rate matching manner, a maximum integer less than or equal to $\log_2 M$ is selected for n. To be specific, $N_1=2^7=128$. In this case, $R_1>R_2$. If a smaller value is determined for $N_1$, $R_1$ is larger, and $R_1$ is definitely greater than $R_2$. If $R_2$ is set to 1/6, $R_1 >> R_2$. In this case, no available value of $N_1$ can meet the repetition-based rate matching manner. For another example, when M=288, 8 is obtained by performing rounding on $\log_2 M$, and in theory, a value of n may range from 1 to 8. In the example shown in FIG. 5, in the repetition-based rate matching manner, a maximum integer less than or equal to $\log_2 M$ is determined for n. To be specific, $2^8=256$, and the condition $R_1 \leq R_2$ is met. In this case, if $N_1$ is equal to 128, the condition $R_1 \leq R_2$ is not met. If the code rate threshold $R_2$ is set to 1/7, regardless of whether $N_1$ is equal to 256 or 128, the condition $R_1 \leq R_2$ is not met. In this case, the shortening or puncturing rate matching manner is used.

For another example, it is assumed that the quantity K of information bits is equal to 200, the target code length M is equal to 2400, and the code rate threshold $R_2$ is equal to 1/4. A maximum value of $N_1$ may be 2048, 1024, 512, or the like. $R_1$ is respectively 200/2048, 200/1024, or 200/512. When $N_1$ is 2048 or 1024, $R_1 \leq R_2$ is met, and the repetition-based rate matching manner may be used. When at least two mother code lengths meet the preset condition, a mother code length with lowest encoding and decoding complexity, that is, a minimum mother code length, may be determined. In this example, if both 2048 and 1024 meet the preset condition, 1024 is determined as the value of $N_1$. In other words, when it is determined that the repetition-based rate matching manner is to be used, a minimum candidate mother code length that meets the preset condition is preferentially determined as the first mother code length.

In this embodiment of this application, provided that the value of $N_1$ can meet $R_1 \leq R_2$, the repetition-based rate matching manner is determined; and only when no value of $N_1$ meets $R_1 \leq R_2$, the shortening or puncturing rate matching manner is used.

That the target code length M meets the preset condition described in step 302 may be: It is determined that the target code length M is greater than or equal to a preset maximum mother code length $N_{max}$. A value of $N_{max}$ may be flexibly set, depending on an actual application scenario, to an integer power of 2, such as 2048, 1024, 512, 256, 128, 64, or 32. This is not limited. Herein, the value of $N_{max}$ has no upper limit, but is determined depending on an application scenario. For example, in some application scenarios, for example, in a data channel, if the target code length reaches 6000 or 12000, the value of $N_{max}$ may be larger. For example, the value may be 4096 or 8192. If it is determined that the repetition manner is to be used to perform rate matching and the first mother code length is $N_{max}$, a transmitting end constructs and encodes a polar code with a length $N_{max}$, and repeats (M-$N_{max}$) bits, to obtain the first target polar code with the target code length M. A receiving end combines an LLR signal at a repetition location, restores a received signal to the mother code length $N_{max}$, and then performs decoding.

For example, $N_{max}=2048$, the target code length M is equal to 600, and M<$N_{max}$. In this case, the shortening or puncturing manner is used to perform rate matching, and a minimum integer power of 2 that is greater than 600, namely, 1024, is determined as a mother code length. A polar code is constructed based on the mother code length 1024 and the target code length 600, and 1024 bits are obtained through encoding and are shortened or punctured by 424 bits, to obtain target 600 bits.

For example, $N_{max}=1024$, the target code length M is equal to 2400, and M>$N_{max}$. In this case, the repetition manner is used to perform rate matching, and it is determined that the mother code length is 1024. A polar code is constructed based on the mother code length 1024, 1024 bits are obtained through encoding, and 1376 bits are obtained through repetition, to obtain a 2400-bit target polar code. If $N_{max}=2048$, M>$N_{max}$ is still met. A polar code may be constructed based on the code length 2048, 2048 bits are obtained through encoding, and 352 bits are repeated, to obtain a 2400-bit target polar code.

If in a system, a maximum quantity of information bits is 200, and a minimum code rate is 1/12, a target code length is 2400. According to a conventional rate matching manner, encoding needs to be performed until 4096 bits are obtained, and then puncturing or shortening is performed, to obtain 2400 bits. According to the solutions in this application, an encoding gain is considered. 2048/1024 bits are obtained through encoding, and then 2400 bits are obtained through repetition. Compared with the conventional rate matching manner, there is almost no encoding gain loss (when 1024 bits are obtained through encoding, an encoding gain loss is within 0.1 dB). However, from a perspective of complexity, compared with a buffer for performing encoding to obtain 4096 bits, a buffer for performing encoding to obtain 2048 or 1024 bits is decreased to 1/2 or 1/4. Operation complexity is significantly reduced, and a decoding delay may be decreased by approximately 20% or 50%.

Figure 6:
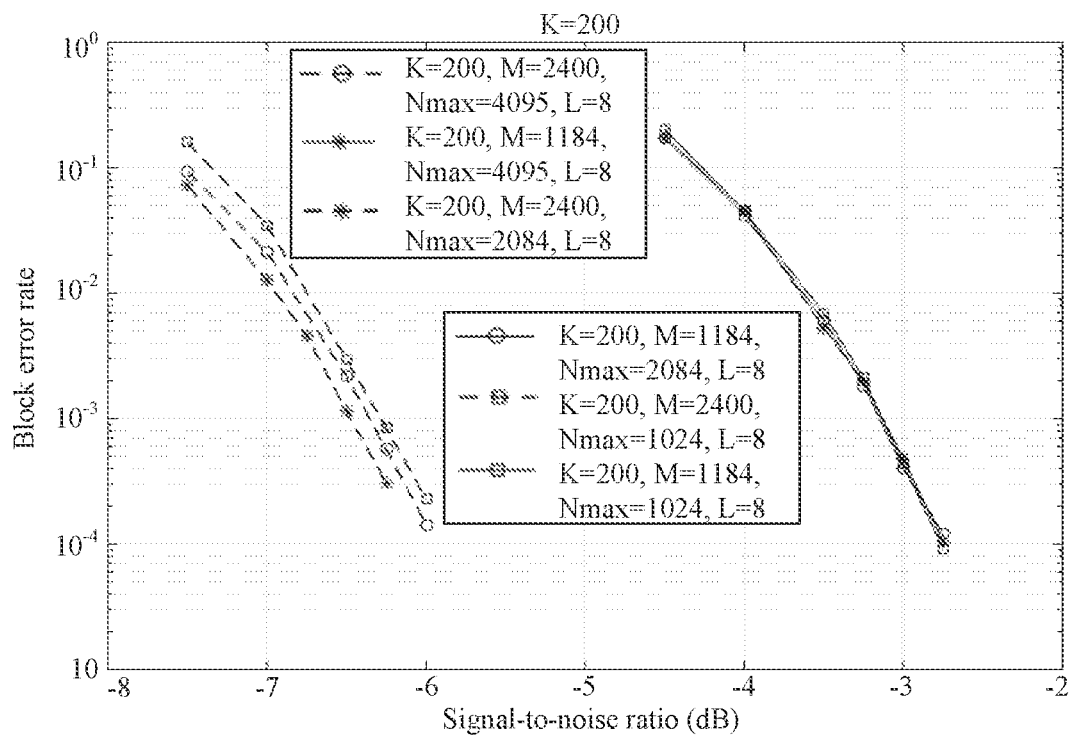
FIG. 6 is a diagram of a performance comparison in an AWGN between a repetition-based rate matching manner and a shortening-based rate matching manner that are determined by using a maximum mother code length.

FIG. 6 shows a performance comparison between a repetition-based rate matching manner and a shortening-based rate matching manner that are used in an AWGN channel. A quantity K of information bits is equal to 200. In this figure, a target code length M corresponding to a solid line group is 1184. A mother code length corresponding to a square box is 1024, and 160 bits are repeated, to obtain 1184 bits. A mother code length corresponding to either an asterisk "*" or a circle "o" is 2048, and 1184 bits are obtained through shortening. It can be learned from FIG. 6 that an encoding gain in the repetition-based rate matching manner is equivalent to that in the shortening-based rate matching manner.

A target code length corresponding to a dashed line group in FIG. 6 is 2400. A mother code length corresponding to a square box is 1024, and 1376 bits are obtained through repetition, to obtain 2400 bits. A mother code length corresponding to an asterisk "*" is 2048, and 352 bits are repeated, to obtain 2400 bits. A mother code length corresponding to a circle "o" is 4096 bits, and 2400 bits are obtained through shortening. It can be learned from FIG. 6 that an encoding gain based on 2048 bits in the repetition-based manner is equivalent to that in the shortening-based manner, and an encoding gain loss based on 1024 bits in the repetition-based manner is within 0.05 dB compared with that in the shortening-based manner. However, compared with the shortening manner, when the target code length is not an integer power of 2, the mother code length used in the repetition-based rate matching manner is decreased by at least a half. Therefore, a size of a required buffer can be significantly reduced, encoding and decoding operation complexity is reduced, and a delay is reduced.

Puncturing described in this embodiment of this application includes quasi-uniform puncture (QUP). First, it is determined that the mother code length is an integer power of 2 that is greater than or equal to the target code length. Then, a puncturing (a puncturing location) is determined based on the mother code length and the target code length. The puncturing mode may be indicated by using a binary sequence (00 . . . 011 . . . 1), and it is determined that "0" indicates a puncturing location and "1" indicates a location that is not punctured. A channel capacity corresponding to the puncturing location is set to 0 (or an error probability is set to 1, or a signal-to-noise ratio (SNR) is set to be infinitesimal). Reliability of polarized channels is calculated by using a method such as density evolution, Gaussian approximation, or linear fitting and is sorted, to determine locations of an information bit and a fixed bit (a frozen bit). An encoder side deletes an encoded bit that is at the puncturing location, to obtain a polar code.

A polar code shortening described in this application is as follows: It is determined that the mother code length is an integer power of 2 that is greater than or equal to the target code length. An encoded bit at a shortening location is only related to a fixed bit. A process includes: Reliability of polarized channels is calculated based on a mother code, then a shortening location is determined, a fixed bit is placed in a corresponding polarized channel, locations of an information bit and a frozen bit (a fixed bit) in a remaining polarized channel are determined based on the reliability, and an encoded bit at the shortening location is deleted, to obtain a polar code, and to implement rate matching. According to the shortening-based rate matching manner, the reliability of the polarized channels does not need to be recalculated based on the shortening location, but the fixed bit is placed in the polarized channel corresponding to the shortening location. This greatly reduces complexity of constructing a polar code.

Figure 7:
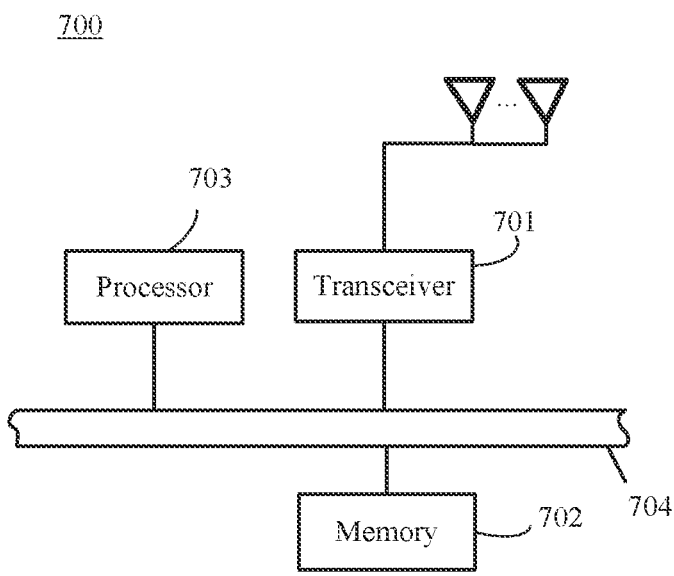
FIG. 7 is a schematic diagram of a communications apparatus according to an embodiment of this application.

As shown in FIG. 7, this application provides another communications apparatus 700 that can implement encoding and rate matching. The communications apparatus 700 includes: a transceiver 701, configured to communicate with another device; a memory 702, configured to store a program; and a processor 703, configured to execute the program stored in the memory. When the program is executed, the processor is configured to: when a target code length M during polar encoding meets a preset condition, use a polar code with a first mother code length $N_1$ to encode an information bit sequence, to output a first encoded bit sequence, where $N_1$ is less than or equal to M, and $N_1$ is an integer power of 2, and repeat at least some bits in the first encoded bit sequence, to obtain a first target polar code with a length M; or when the target code length M does not meet the preset condition, use a polar code with a second mother code length $N_2$ to encode the information bit sequence, to output a second encoded bit sequence, where $N_2$ is greater than or equal to M, and $N_2$ is an integer power of 2, and shorten or puncture the second encoded bit sequence, to obtain a second target polar code with a length M. The transceiver 701, the memory 702, and the processor 703 are connected by using a bus.

Determining whether the target code length M meets the preset condition and a corresponding rate matching implementation are the same as those described above. Whether a repetition or a shortening or puncturing is used may be determined by using a mother code code rate threshold or a maximum mother code length, so that an encoding gain and complexity are balanced. A repetition process and a shortening or puncturing process may be the same as those described above.

In some embodiments, the communications apparatus has both encoding and decoding functions. When serving as a sender, the communications apparatus performs an encoding and rate matching procedure. When serving as a receiver, the communications apparatus performs a rate de-matching and decoding procedure. The communications apparatus includes a baseband chip. The baseband chip includes an encoder and a decoder. The encoder may be configured to perform a function that is the same as that of the foregoing encoding apparatus, and the decoder may perform a function that is the same as that of the foregoing decoding apparatus. The communications apparatus includes a device that has a bidirectional wireless communications function, such as a base station or user equipment.

Figure 8:
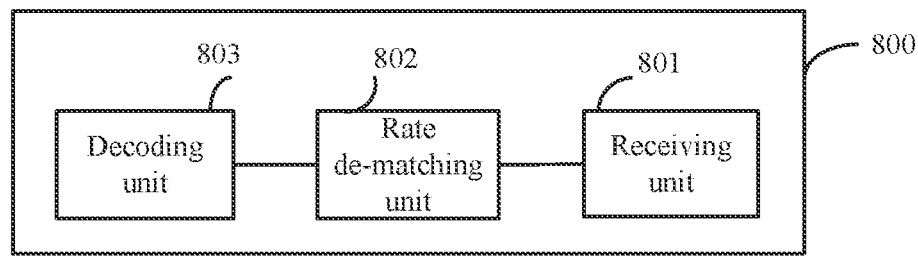
FIG. 8 is a schematic diagram of a decoding apparatus according to an embodiment of this application.
Figure 9:
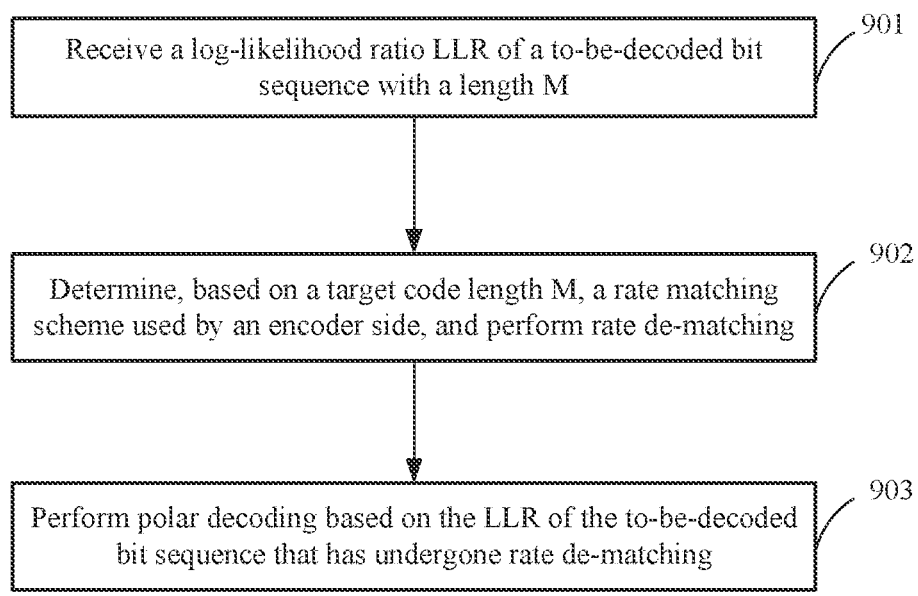
FIG. 9 is a flowchart of a rate de-matching method according to an embodiment of this application.

A decoding apparatus 800 shown in FIG. 8 may be configured to perform rate de-matching and decoding in this application. The decoding apparatus 800 includes a receiving unit 801, a rate de-matching unit 802, and a decoding unit 803. As shown in FIG. 9, a rate de-matching and decoding process includes the following steps.

901. Receive a log-likelihood ratio (LLR) of a to-be-decoded bit sequence with a length M, where M is a target code length during polar encoding.

The receiving unit 801 receives the LLR of the to-be-decoded bit sequence with the length M, where M is the same as the target code length used by an encoder side to perform polar encoding.

902. Determine, based on the target code length M, a rate matching manner used by an encoder side, and perform rate de-matching.

When the target code length M meets a preset condition, a rate de-matching unit 802 determines that a transmitting end uses a repetition manner to perform rate matching, determines a location of a repeated bit, and adds and combines an LLR, at a repetition location, in received LLRs of M bits, to obtain an LLR of a first to-be-decoded bit sequence whose length is a first mother code length $N_1$, where $N_1$ is less than or equal to M, and $N_1$ is an integer power of 2.

When the target code length M does not meet the preset condition, the rate de-matching unit 802 determines that the encoder side uses a shortening or puncturing method to perform rate matching, determines a shortening or puncturing location and an LLR at the shortening or puncturing location, and restores LLRs, received by the receiving unit 801, of M bits to a second mother code length $N_2$, to obtain an LLR of a second to-be-decoded bit sequence whose length is the second mother code length $N_2$, where $N_2$ is greater than or equal to M, and $N_2$ is an integer power of 2.

If the encoder side uses the repetition manner to perform rate matching, a decoder side correspondingly performs rate de-matching according to a repetition rule preset by both the encoder side and the decoder side. For example, if the repetition rule of the encoder side is in an order from back to front, during rate matching, LLRs of last M-$N_1$ bits in the M bits are added and combined, to obtain LLRs of $N_1$ to-be-decoded bits.

If the encoder side uses the shortening manner to perform rate matching, the rate de-matching unit 802 uses a bit at the shortening location as a known bit, sets a corresponding LLR to be infinite, and restores the LLR, together with a received LLR at a location that is not shortened, to a mother code length.

If the encoder side uses the puncturing manner to perform rate matching, the rate de-matching unit 802 uses a bit corresponding to a puncturing location as an unknown bit for processing, sets a corresponding log-likelihood ratio to 0, and restores the log-likelihood ratio, together with a received LLR at a location that is not punctured, to a mother code length.

903. Perform polar decoding based on the LLR of the to-be-decoded bit sequence that has undergone rate de-matching.

When the target code length M meets the preset condition, a decoding unit 803 correspondingly performs polar decoding based on the LLR of the first to-be-decoded bit sequence.

When the target code length M does not meet the preset condition, the decoding unit 803 correspondingly performs polar decoding based on the LLR of the second to-be-decoded bit sequence.

Like the encoder side, that the target code length M meets the preset condition described in step 902 and step 903 may be that a first code rate $R_1$ determined based on a quantity K of information bits and the target code length M is less than or equal to a preset second code rate $R_2$. The first code rate $R_1$ herein is equal to $K/N_1$. K is the quantity of information bits, $N_1=2^n$, and n is an integer less than or equal to $\log_2 M$. A determination process of $N_1$ is the same as that on the encoder side. The second code rate may also be referred to as a mother code code rate threshold and is preset on the encoder side and the decoder side. A value of $R_2$ is the same as that on the encoder side, and may be 1/4 or 1/6. For example, $R_2$ on the encoder side is 1/4, and is also 1/4 on the decoder side. When $R_1 \leq R_2$, it is determined that the encoder side uses a repetition rate matching manner, and a used mother code length is $N_1$. When $R_1 > R_2$, it is determined that the encoder side uses a shortening or puncturing manner.

Alternatively, the preset condition may be as follows: A maximum mother code length $N_{max}$ is set, and the target code length M is compared with the maximum mother code length. If $M \geq N_{max}$ is met, it is determined that the transmitting end uses the repetition manner to perform rate matching, and therefore the decoder side correspondingly manner performs rate de-matching. If $M < N_{max}$ it is determined that the transmitting end uses the shortening or puncturing manner to perform rate matching, and the decoder side correspondingly performs rate de-matching. Like the encoder side, $N_{max}$ may be set to an integer power of 2, such as 2048, 1024, 512, 256, 128, 64, or 32. This is not limited.

The encoder side and the decoder side may preset to use the shortening rate matching manner or the puncturing rate matching manner when the target code length M does not meet the preset condition. For example, the shortening manner is uniformly used, or the puncturing manner is uniformly used.

A communications apparatus shown in FIG. 7 may also be configured to perform a rate de-matching and decoding process. The communications apparatus includes: a transceiver 701, configured to communicate with another device; a memory 702, configured to store a program; and a processor 703, configured to execute the program stored in the memory 701. When the program is executed, the processor 703 is configured to: when a target code length M during polar encoding meets a preset condition, determine that a transmitting end uses a repetition manner to implement rate matching; determine a location of a repeated bit; add and combine an LLR, at a repetition location, in received LLRs of M bits, to obtain an LLR of a first to-be-decoded bit sequence whose length is a first mother code length $N_1$, where $N_1$ is less than or equal to M, and $N_1$ is an integer power of 2; and perform polar decoding based on the LLR of the first to-be-decoded bit sequence.

Alternatively, the processor 703 is configured to: when the target code length M does not meet the preset condition, determine that the transmitting end uses a shortening or puncturing method to implement rate matching; determine a shortening or puncturing location and an LLR at the shortening or puncturing location; restore the received LLRs of M bits to a second mother code length $N_2$, to obtain an LLR of a second to-be-decoded bit sequence whose length is the second mother code length $N_2$, where $N_2$ is greater than or equal to M, and $N_2$ is an integer power of 2; and perform polar decoding based on the LLR of the second to-be-decoded bit sequence.

Determining whether the target code length M meets the preset condition and a corresponding rate de-matching implementation are the same as those described above. Whether an encoder side uses a repetition-based rate matching manner or a shortening or puncturing rate matching manner may be determined by using a mother code code rate threshold or a maximum mother code length.

The solutions in this application may be used in a control channel or a data channel. A relatively small quantity of information bits need to be sent in the control channel. Therefore, in an embodiment, when encoding and decoding are performed, code lengths (mother code lengths) and rate matching manners used in various cases may be listed depending on whether the target code length meets the preset condition described in this application, and stored on an encoder side and a decoder side. In other words, the encoder side and the decoder side do not need to determine whether the target code length meets the preset condition. Instead, the encoder side and the decoder side directly read a corresponding parameter from a configured parameter according to a specified rule to perform encoding, rate matching, and corresponding rate de-matching and decoding. In an example, assuming that a manner of the mother code code rate (a code rate for encoding) threshold is used and a code rate threshold R is set to 1/4, a configured encoding parameter may be stored in a form shown in Table 1. In this case, a quantity of information bits, a target code length, a mother code length, and a rate matching manner have been determined according to a preset rule. Alternatively, the rate matching manner may not be shown. If the mother code length is less than or equal to the target code length, it is determined that the repetition rate matching manner is used. If the mother code length is greater than the target code length, it is determined that the shortening or puncturing manner is used. The encoder side and the decoder side may uniformly specify whether the shortening manner or the puncturing manner is used and a corresponding shortening mode or puncturing mode. Certainly, the rate matching manner may alternatively be shown in the configured parameter. How to perform repetition may also be configured on the encoder side and the decoder side.

TABLE 1

| Quantity K of information bits | Target code length M | Mother code length N | Rate matching manner |
|---|---|---|---|
| ... | ... | ... | ... |
| 40 | 224 | 256 | Shortening or puncturing |
| 40 | 288 | 256 | Repetition |
| ... | ... | ... | ... |
| 200 | 2400 | 1024 | Repetition |
| 200 | 1200 | 1024 | Repetition |
| 200 | 800 | 1024 | Shortening or puncturing |

Provided that the preset condition is determined, a mother code length and a rate matching manner used in each case can be determined. For example, when $R_2$ is 1/6, encoding parameters and rate matching manners used in different cases may be determined.

The communications apparatus described in this embodiment of this application may be a wireless communications device such as an access point, a station, a base station, or a user terminal.

A polar code described in this embodiment of this application includes, but is not limited to, an Arikan polar code, or may be a CA-polar code or a PC-polar code. The Arikan polar code is an original polar code, is not cascaded with another code, and has only an information bit and a frozen bit. The CA-polar code is a polar code cascaded with a cyclic redundancy check (CRC). The PC-polar code is a polar code cascaded with a parity check (PC) code. The PC-polar code and the CA-polar code improve performance of a polar code by cascading different codes.

An "information bit sequence" described in this embodiment of this application may also be referred to as a "to-be-encoded bit sequence" or an "information bit set". Correspondingly, the "quantity of information bits" may be a quantity of to-be-encoded bits in the to-be-encoded bit sequence or a quantity of elements in the information bit set.

That the target code length M meets the preset condition described in this application may be further that a difference between the target code length M and the first mother code length $N_1$ is less than a preset range. $N_1$ is less than or equal to M, and $N_1$ is an integer power of 2. For example, the preset condition may be $M \leq N_1*(1+\delta)$. If the mother code length $N_1$ meets the condition, it is determined that the repetition-based rate matching manner is used, the first mother code length $N_1$ is used to perform polar encoding, to obtain a first encoded bit sequence, and at least some bits in the first encoded bit sequence are repeated, to obtain an encoded bit sequence with the target code length. If the condition is not met, the shortening-based or puncturing-based rate matching manner is used. The foregoing preset condition may be further indicated as $$\frac{M}{N_1} \leq (1+\delta),\ M - N_1 \leq N_1 * \delta,\ \text{or}\ \frac{M - N_1}{N_1} \leq \delta.$$

δ may be a constant, for example, may be set to 1/8, 1/4, or 3/8.

δ may be a value related to a code rate. δ=FUNCTION($R_1$) is a function of $$R_1 = \frac{K}{N_1}, \delta$$

usually decreases as $R_1$ increases, and K is the quantity of information bits. In other words, a value of δ is related to the quantity of information bits and the mother code length.

In an implementation, a function of δ relative to a code rate $R_1$ may be designed as $\delta = \beta*(1-R_1)$. β is a preset constant. For example, β may be 1/2, 3/8, 1/4, 1/8, or 1/16. In other words, δ is a linear function of $R_1$. Larger $R_1$ results in smaller δ, and a smaller quantity of bits are allowed to be repeated.

Assuming that M=160, K=80, β=1/2, and $N_1$=128, $R_1$=80/128=0.625, and δ=1/2*(1−80/128)=0.1875. $M \leq N_1*(1+\delta)$ is used to determine whether to use the repetition rate matching, and $N_1*(1+S)=128*(1+0.1875)=152$. Because M=160>152, and $M \leq N_1*(1+\delta)$ is not met, the repetition rate matching manner is not used. Instead, another manner such as the shortening or puncturing manner may be used. In the foregoing parameters, if K=32 and other parameters keep unchanged, $R_1$=32/128=1/4, δ=1/2*(1−1/4)=3/8, $N_1*(1+\delta)$ =128*(1+3/8)=176, M=160<176, and $M \leq N_1*(1+\delta)$ is met. Therefore, the repetition-based rate matching manner is used. To be specific, the first mother code length is 128. An encoded bit sequence with a length 128 is obtained through encoding, and 32 bits in the encoded bit sequence are repeated, to obtain a target code length 160.

In another implementation, a function of S relative to a code rate R may be designed as $\delta = \beta*(1-R_1)^2$, a is a constant. For example, β may be 1/2. To be specific, δ is a quadratic function of $R_1$. Larger $R_1$ results in smaller δ, and a smaller quantity of bits are allowed to be repeated. Assuming that M=160, K=80, 0=1/2, and $N_1$=128, $R_1$=80/128=0.625, and δ=1/2*(1−80/128)²=0.0703125. $M \leq N_1*(1+\delta)$ is used to determine whether to use the repetition rate matching, and $N_1*(1+\delta)=128*(1+0.0703125)=137$. Because M=160>137, and $M \leq N_1*(1+\delta)$ is not met, the repetition rate matching manner is not used. Instead, another manner such as the shortening or puncturing manner may be used. In the foregoing parameters, if K=32 and other parameters keep unchanged, $R_1$=32/128=1/4, δ=1/2*(1−1/4)²=9/32, $N_1*(1+\delta)=128*(1+9/32)=164$, M=160<164, and $M \leq N_1*(1+\delta)$ is met. Therefore, the repetition-based rate matching manner is used. To be specific, the first mother code length is 128. An encoded bit sequence with a length 128 is obtained through encoding, and 32 bits in the encoded bit sequence are repeated, to obtain a target code length 160.

In another implementation, a function of S relative to a code rate $R_1$ may be designed as.

$$\delta = \begin{cases} a, \text{ if } R_1 < R_3 \\ 0, \text{ if } R_1 \geq R_3 \end{cases} \quad \text{Formula (1)}$$

$\delta$ is a piecewise function determined based on $R_1$. If $R_1$ is less than a preset threshold $R_3$, a value of $\delta$ is a, a is a constant, and a value of a may be 1/16, 1/4, 3/8, 1/2, or the like. If $R_1$ is greater than or equal to the threshold $R_3$, a value of S is 0. $R_3$ may be 1/4 or 1/6, or may be 1/3, 1/4, 1/5, 1/7, 1/8, 1/9, 1/10, 1/11, 1/12, 2/7, 3/8, 2/9, 3/10, 2/11, 3/11, or the like. Assuming that M=160, K=80, R3=1/4, and $N_1$=128, $R_1$=80/128=0.625>1/4, and $\delta$=0 based on the formula (1). $M \leq N_1*(1+\delta)$ is used to determine whether to use the repetition rate matching, and $N_1*(1+\delta)=128*(1+0)=128$. Because M=160>128, and $M \leq N_1*(1+\delta)$ is not met, the repetition rate matching manner is not used. Instead, another manner such as the shortening or puncturing manner may be used. In the foregoing parameters, if K=32 and other parameters keep unchanged, $R_1$=32/128=1/4=$R_3$, a value of $\delta$ is 0, and the repetition rate matching manner is not used. If $R_3$=1/6, $R_1$=32/128=1/4<$R_3$, a value of $\delta$ is 1/8. $N_1*(1+S)$ =128*(1+1/8)=144, M=160>144, and $M \leq N_1*(1+\delta)$ is not met. Therefore, the repetition rate matching manner is not used. Instead, another manner such as the shortening or puncturing manner may be used. If in the formula (1), $R_1 < R_3$, and a value of $\delta$ is 1/2, $N_1*(1+\delta)=128*(1+1/2)=192$, M=160<192, and $M \leq N_1*(1+\delta)$ is met. Therefore, the repetition-based rate matching manner is used. To be specific, the first mother code length is 128, an encoded bit sequence with a length 128 is obtained through encoding, and 32 bits in the encoded bit sequence are repeated, to obtain a target code length 160.

Figure 10:
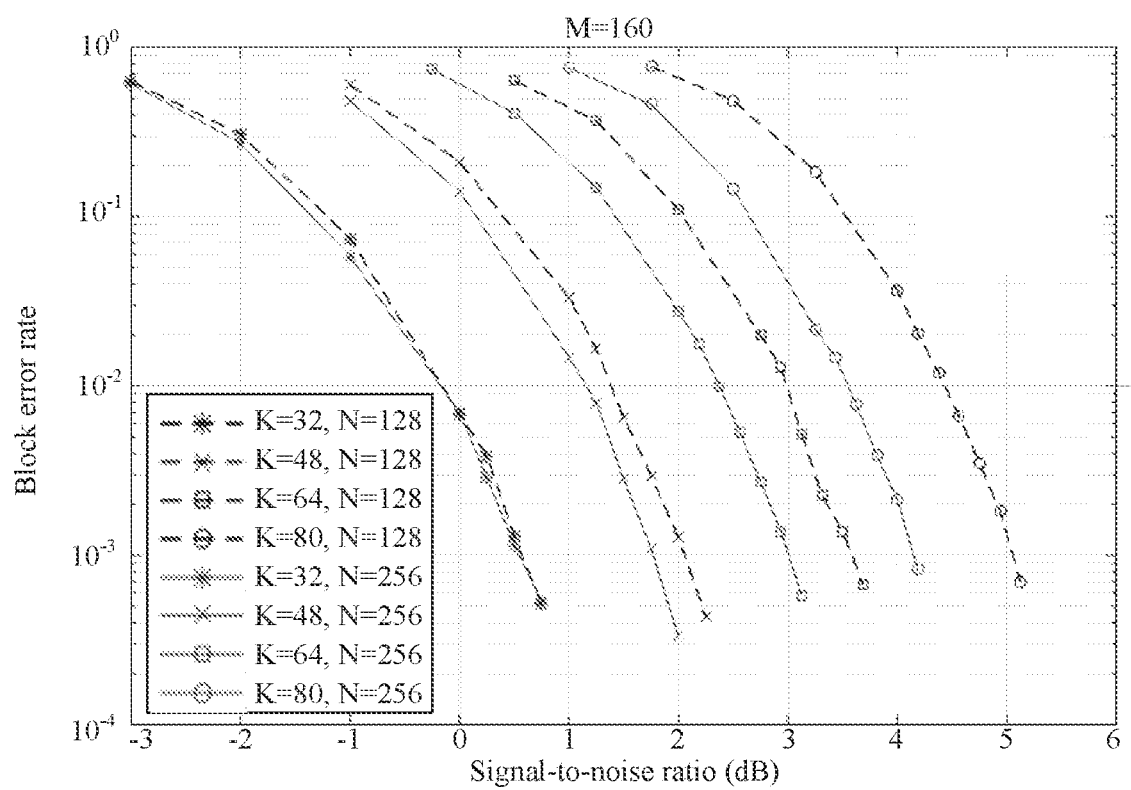
FIG. 10 shows a performance comparison between a repetition-based manner and a puncturing-based manner when M=160 and K has different values.

FIG. 10 shows a performance comparison between a repetition-based manner and a puncturing-based manner that are used when M=160 and K has different values. A dashed line indicates that the repetition-based rate matching manner is used, and a solid line indicates that the puncturing-based rate matching manner is used. The target code length is set to a fixed value 160. The target code length may be obtained by performing puncturing based on 256 (the solid line) or obtained by performing repetition based on 128 (the dashed line). If repetition is performed based on 128, a quantity of bits that need to be repeated is (160-128), that is, 32, and a repetition proportion is 32/128=1/4. It can be learned from FIG. 10 that when quantities of information bits are different, that is, code rates are different, performance of the repetition manner is different from performance of the puncturing manner. When a code rate is high (K is relatively large, for example, K=80), compared with the puncturing manner, the repetition manner has an obvious performance loss (approximately 0.7 dB). When a code rate is low (K is relatively small, for example, K=20 or K=40), performance of the repetition manner is equivalent to performance of the puncturing manner. Therefore, a value of S is determined based on a code rate, and $\delta$ decreases as $R_1$ increases. When performance losses are equivalent or slightly different, the repetition rate matching is used, so that a desirable balance is achieved between an encoding gain loss and complexity.

This application provides a plurality of embodiments to determine whether the target code length M meets the preset condition. In another embodiment, a minimum value may be determined as a value of the first mother code length from all values of $N_1$ that meet any one of the foregoing preset conditions, and the repetition-based rate matching manner is used. If no value of the first mother code length meets the preset condition, the shortening or puncturing manner is used. Assuming that M=576 and K=20, a set of values of $N_1$ corresponding to cases in which the repetition-based rate matching manner is allowed to be used is obtained based on different preset conditions.

A preset condition 1: A first code rate $R_1$ determined based on the quantity K of the information bits and the target code length M is less than or equal to a preset second code rate $R_2$, and $R_1$=K/$N_1$. Herein, a value of $R_2$ is 1/4, and based on $R_1$=K/$N_1$, a value of $N_1$ that meets $R_1<R_2$ is 512, 256, or 128.

A Preset Condition 2:

The target code length is greater than a preset maximum mother code length $N_{max}$, and $N_{max}$ is 512. Based on M=576>512, the preset condition is met, the repetition-based rate matching manner is used, and $N_1$=512.

A Preset Condition 3:

A difference between the target code length M and the first mother code length $N_1$ is less than the preset range, and indicated by $M \leq N_1*(1+\delta)$. A value of $\delta$ is determined by using the formula (1), a=1/8, and $R_3$=1/6. If $N_1$=512, $R_1$=20/512<$R_3$, and $\delta$ is 1/8, $N_1*(1+\delta)$=576. $M=N_1*(1+\delta)$, and the preset condition is met. If $N_1$=256, $R_1$=20/256<$R_3$, and $\delta$ is 1/8, $N_1*(1+\delta)$=288, $M>N_1*(1+\delta)$, and the preset condition is not met. Therefore, a value of $N_1$ that is determined based on the preset condition 3 and that allows use of the repetition-based rate matching manner is 512.

A set of values of $N_1$ obtained based on the foregoing three preset conditions is {128, 256, 512}. The repetition-based rate matching manner is used, the minimum value 128 is determined as the value of the first mother code length, an encoded bit sequence with a length 128 is obtained through encoding, and the encoded bit sequence is repeated, to obtain a target code length 576. Parameters in the foregoing three preset conditions may be flexibly set with reference to the embodiments provided in this application.

Units and method processes in the examples described in the embodiments of this application can be implemented by electronic hardware or a combination of computer software and electronic hardware. Whether the functions are performed by hardware or software depends on particular applications and design constraint conditions of the technical solutions. Different methods may be used to implement the described functions for each particular application.

In the several embodiments provided in this application, it should be understood that the disclosed apparatus and method may be implemented in other manners. For example, the described apparatus embodiments are merely examples. For example, the unit division is merely logical function division and may be other division during actual implementation. For example, a plurality of units or components may be combined or integrated into another system, or some steps may be ignored or not performed. In addition, couplings or direct couplings or communications connections between the units may be implemented in electrical, mechanical, or other forms.

The units described as separate parts may or may not be physically separate, may be located in one position, or may be distributed on a plurality of network units.

In addition, functional units in the embodiments of this application may be integrated into one processing unit, or each of the units may exist alone physically, or two or more units may be integrated into one unit.

All or some of the foregoing embodiments may be implemented by using software, hardware, firmware, or any combination thereof. When the software is used to implement the embodiments, all or some of the embodiments may be implemented in a form of a computer program product. The computer program product includes one or more computer instructions. When the computer program instructions are loaded and executed on a computer, all or some of the procedures or functions in the embodiments of the present invention are generated. The computer may be a general-purpose computer, a special-purpose computer, a computer network, or another programmable apparatus. The computer instructions may be stored in a computer readable storage medium, or transmitted by using the computer readable storage medium. The computer instructions may be transmitted from a website station, a computer, a server, or a data center to another website station, computer, server, or data center in a wired (for example, a coaxial cable, an optical fiber, or a digital subscriber line (DSL)) or wireless (for example, an infrared ray, radio, or a microwave) manner. The computer readable storage medium may be any available medium that can be accessed by a computer, or may be a data storage device such as an integrated server including one or more available media (for example, a cloud server) or a data center. The available medium may be a magnetic medium (for example, a floppy disk, a hard disk, a magnetic tape, a USB flash drive, a ROM, or a RAM), an optical medium (for example, a CD or a DVD), or a semiconductor medium (for example, a solid state disk (SSD)).

What is claimed is:

1. An encoding method, comprising:
   obtain an information bit sequence and a target code length M of a polar code;
   when a preset condition related to code rate is satisfied, polar encode the information bit sequence to output a first encoded bit sequence with a first mother code length $N_1$, and repeat one or more bits in the first encoded bit sequence, to obtain a first target polar code with a length M; wherein $N_1$ is less than or equal to M, and $N_1$ is an integer power of 2;
   wherein the preset condition related to code rate comprises: a first code rate $R_1$ determined based on a quantity K of information bits in the information bit sequence and the target code length M is less than or equal to a preset second code rate $R_2$, wherein the first code rate $R_1$ is equal to $K/N_1$, $N_1=2^n$, and n is an integer less than or equal to $\log_2 M$.

2. The method according to claim 1, further comprising:
   when the preset condition related to code rate is not satisfied, polar encode the information bit sequence, to output a second encoded bit sequence having a second mother code length $N_2$, and shorten or puncture the second encoded bit sequence, to obtain a second target polar code with a length M, wherein $N_2$ is greater than or equal to M, and $N_2$ is an integer power of 2.

3. The method according to claim 1, wherein n is a maximum integer less than or equal to $\log_2 M$.

4. The method according to claim 1, wherein a value of the preset second code rate is 1/2, 1/3, 1/4, 1/5, 1/6, 1/7, 1/8, 1/9, 1/10, 1/11, 1/12, 2/7, 3/8, 2/9, 3/10, 2/11, or 3/11.

5. An apparatus in a wireless communication network, comprising at least one processor and at least one memory storing program instructions, wherein when executed by the at least one processor, the program instructions cause the apparatus to:
   obtain an information bit sequence and a target code length M of a polar code;
   when a preset condition related to code rate is satisfied, polar encode the information bit sequence to output a first encoded bit sequence with a first mother code length $N_1$, and repeat one or more bits in the first encoded bit sequence, to obtain a first target polar code with a length M; wherein $N_1$ is less than or equal to M, and $N_1$ is an integer power of 2;
   the preset condition related to code rate comprises: a first code rate $R_1$ determined based on a quantity K of information bits in the information bit sequence and the target code length M is less than or equal to a preset second code rate $R_2$, wherein the first code rate $R_1$ is equal to $K/N_1$, $N_1=2^n$, and n is an integer less than or equal to $\log_2 M$.

6. The apparatus according to claim 5, wherein when executed by the at least one processor, the program instructions further cause the apparatus to:
   when the preset condition related to code rate is not satisfied, polar encode the information bit sequence, to output a second encoded bit sequence having a second mother code length $N_2$, and shorten or puncture the second encoded bit sequence, to obtain a second target polar code with a length M, wherein $N_2$ is greater than or equal to M, and $N_2$ is an integer power of 2.

7. The apparatus according to claim 6, wherein n is a maximum integer less than or equal to $\log_2 M$.

8. The apparatus according to claim 6, wherein a value of the preset second code rate is 1/2, 1/3, 1/4, 1/5, 1/6, 1/7, 1/8, 1/9, 1/10, 1/11, 1/12, 2/7, 3/8, 2/9, 3/10, 2/11, or 3/11.

9. A non-transitory computer readable medium storing program codes thereon for execution by at least one processor in a communication apparatus, wherein the program codes comprise instructions, when executed by the at least one processor, causing the communication apparatus to:
   obtain an information bit sequence and a target code length M of a polar code;
   when a preset condition related to code rate is satisfied, polar encode the information bit sequence to output a first encoded bit sequence with a first mother code length $N_1$, and repeat one or more bits in the first encoded bit sequence, to obtain a first target polar code with a length M; wherein $N_1$ is less than or equal to M, and $N_1$ is an integer power of 2;
   wherein the preset condition related to code rate comprises: a first code rate $R_1$ determined based on a quantity K of information bits in the information bit sequence and the target code length M is less than or equal to a preset second code rate $R_2$, wherein the first code rate $R_1$ is equal to $K/N_1$, $N_1=2^n$, and n is an integer less than or equal to $\log_2 M$.

10. The non-transitory computer readable medium according to claim 9, wherein the instructions, when executed by the at least one processor, further cause the apparatus to:
    when the preset condition related to code rate is not satisfied, polar encode the information bit sequence, to output a second encoded bit sequence having a second mother code length $N_2$, and shorten or puncture the second encoded bit sequence, to obtain a second target polar code with a length M, wherein $N_2$ is greater than or equal to M, and $N_2$ is an integer power of 2.

11. The non-transitory computer readable medium according to claim 9, wherein n is a maximum integer less than or equal to $\log_2 M$.

12. The non-transitory computer readable medium according to claim 9, wherein a value of the preset second code rate is 1/2, 1/3, 1/4, 1/5, 1/6, 1/7, 1/8, 1/9, 1/10, 1/11, 1/12, 2/7, 3/8, 2/9, 3/10, 2/11, or 3/11.

\* \* \* \* \*